United States Patent
Zhang et al.

(10) Patent No.: US 9,343,466 B1
(45) Date of Patent: May 17, 2016

(54) METHODS FOR FABRICATING FLASH MEMORY CELLS AND INTEGRATED CIRCUITS HAVING FLASH MEMORY CELLS EMBEDDED WITH LOGIC

(71) Applicant: GLOBALFOUNDRIES Singapore Pte. Ltd., Singapore (SG)

(72) Inventors: Zufa Zhang, Singapore (SG); Khee Yong Lim, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/584,973

(22) Filed: Dec. 29, 2014

(51) Int. Cl.
| | |
|---|---|
| H01L 27/115 | (2006.01) |
| H01L 21/02 | (2006.01) |
| H01L 29/423 | (2006.01) |
| H01L 21/28 | (2006.01) |
| H01L 29/788 | (2006.01) |
| H01L 21/3213 | (2006.01) |

(52) U.S. Cl.
CPC ...... *H01L 27/11521* (2013.01); *H01L 21/0223* (2013.01); *H01L 21/02164* (2013.01); *H01L 21/02271* (2013.01); *H01L 21/28273* (2013.01); *H01L 21/32133* (2013.01); *H01L 27/11534* (2013.01); *H01L 29/42328* (2013.01); *H01L 29/7883* (2013.01); *H01L 21/02255* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,324,699 | B2 * | 12/2012 | Ichijo | ............ C23C 16/02 257/228 |
| 2005/0207199 | A1 * | 9/2005 | Chen | ............ G11C 16/0425 365/51 |
| 2014/0097480 | A1 * | 4/2014 | Shum | ............ H01L 27/11521 257/314 |
| 2015/0263010 | A1 * | 9/2015 | Chuang | ............ H01L 27/11534 257/319 |

* cited by examiner

*Primary Examiner* — Jerome Jackson, Jr.
*Assistant Examiner* — Charles R Peters
(74) *Attorney, Agent, or Firm* — Ingrassia Fisher & Lorenz, P.C.

(57) ABSTRACT

Methods for fabricating memory cells, methods for fabricating integrated circuits having memory cells, and integrated circuits having memory cells are provided. In one example, a method for fabricating a memory cell includes depositing a first tunnel dielectric layer over a semiconductor substrate. The method includes depositing a floating gate material over the first tunnel dielectric layer. The method forms two control gate stacks over the floating gate material, defines a source line area between the two control gate stacks, and defines select gate areas adjacent the two control gate stacks. The method includes depositing a second tunnel dielectric layer over the select gate areas of the semiconductor substrate. Further, the method includes forming select gates over the second tunnel dielectric layer over the select gate areas of the semiconductor substrate. The second tunnel dielectric layer forms a gate dielectric layer for each select gate.

20 Claims, 4 Drawing Sheets

METHODS FOR FABRICATING FLASH MEMORY CELLS AND INTEGRATED CIRCUITS HAVING FLASH MEMORY CELLS EMBEDDED WITH LOGIC

TECHNICAL FIELD

The present disclosure generally relates to integrated circuits and methods for fabricating integrated circuits, and more particularly relates to integrated circuits having memory cells, methods for fabricating integrated circuits having memory cells, and methods for fabricating memory cells.

BACKGROUND

Integrated circuits find application in many of today's consumer electronics, such as cell phones, video cameras, portable music players, printers, computers, calculators, automobiles, etc. Integrated circuits may include a combination of active devices, passive devices and their interconnections.

In some instances, integrated circuits may take the form of nonvolatile memory, which can be an integrated circuit device designed to store digital data in the form of an electrical charge. Uniquely, a nonvolatile memory charge remains in storage even after the power is turned off. Accordingly, the use of nonvolatile memory devices can be particularly advantageous for power saving applications or in applications where power can be interrupted.

Nonvolatile flash memory usually takes one of two forms, a stack gate form or a split-gate form. The split-gate form, which is of particular interest herein, is well known in industry today and has a structure equivalent to two transistors in series. One of the two transistors is an enhancement gate transistor and the other is a stacked gate transistor. These two transistors are geometrically joined with the gate of the enhancement transistor being the control gate of the stacked gate transistor. The stacked gate transistor performs like a conventional simple stacked gate cell, where its floating gate is formed by a first layer of polysilicon under a control gate made from a second layer of polysilicon. The number of electrons stored on the floating gate changes the threshold of the stacked gate transistor which determines the value of the stored data on the floating gate. The enhancement gate of the split gate cell performs as a selector for the stacked gate transistor, and has a positive threshold voltage. This allows the enhancement gate to act as a selector for accessed cells and an isolator for deselected cells without consideration of the threshold voltage of the stacked gate transistor.

In conventional fabrication processes, nonvolatile flash memory cells are formed in a memory area of a semiconductor substrate while logic devices are formed elsewhere in a logic area on the semiconductor substrate. In order to optimize processing, certain material layers are formed and utilized on both the memory area and logic area. For example, dielectric material is typically deposited over both memory and logic areas and processed to form select gate dielectric layers in the memory area and to form input/output device gate dielectric, core device gate dielectric, and/or high voltage device gate dielectric layers in the logic area. However, the dual use of such gate dielectric is limiting to the memory cell processing.

Accordingly, it is desirable to provide improved methods for fabricating integrated circuits having memory cells. Also, it is desirable to provide methods for fabricating memory cells that are independent of or less dependent on logic device processing. In addition, it is desirable to provide integrated circuits that include memory cells having improved select gate dielectric layers. Furthermore, other desirable features and characteristics will become apparent from the subsequent detailed description and the appended claims, taken in conjunction with the accompanying drawings and the foregoing technical field and background.

BRIEF SUMMARY

Methods for fabricating memory cells, methods for fabricating integrated circuits having memory cells, and integrated circuits having memory cells are provided. In one embodiment, a method for fabricating a memory cell includes depositing a first tunnel dielectric layer over a semiconductor substrate. The method includes depositing a floating gate material over the first tunnel dielectric layer. The method forms two control gate stacks over the floating gate material, defines a source line area between the two control gate stacks, and defines select gate areas adjacent the two control gate stacks. The method includes depositing a second tunnel dielectric layer over the select gate areas of the semiconductor substrate. Further, the method includes forming select gates over the second tunnel dielectric layer over the select gate areas of the semiconductor substrate. The second tunnel dielectric layer forms a gate dielectric layer for each select gate.

In another embodiment, a method for fabricating an integrated circuit includes providing a semiconductor substrate having a logic area and a memory area. A floating gate material is deposited over the memory area. The method includes forming two control gate stacks over the floating gate material in the memory area. The method deposits a tunnel dielectric layer over the memory area and forms select gates over the tunnel dielectric layer in the memory area. Further, the method deposits a gate dielectric layer over the logic area and forms logic gates over the gate dielectric layer in the logic area.

In accordance with another embodiment, an integrated circuit is provided. The integrated circuit includes a semiconductor substrate including a memory area. The integrated circuit includes a first tunnel dielectric layer overlying the semiconductor substrate in the memory area and a floating gate material overlying the first tunnel dielectric layer. The integrated circuit further includes two control gate stacks overlying the floating gate material. A source line area is defined between the two control gate stacks and select gate areas are defined adjacent the two control gate stacks. The integrated circuit also includes a second tunnel dielectric layer overlying the select gate areas of the semiconductor substrate. Select gates lie over the second tunnel dielectric layer over the select gate areas of the semiconductor substrate. The second tunnel dielectric layer forms a select gate dielectric layer for each select gate.

BRIEF DESCRIPTION OF THE DRAWINGS

Embodiments of the integrated circuits having memory cells, methods for fabricating integrated circuits having memory cells, and methods for fabricating memory cells will hereinafter be described in conjunction with the following drawing figures, wherein like numerals denote like elements, and wherein.

DETAILED DESCRIPTION

Figure 1:
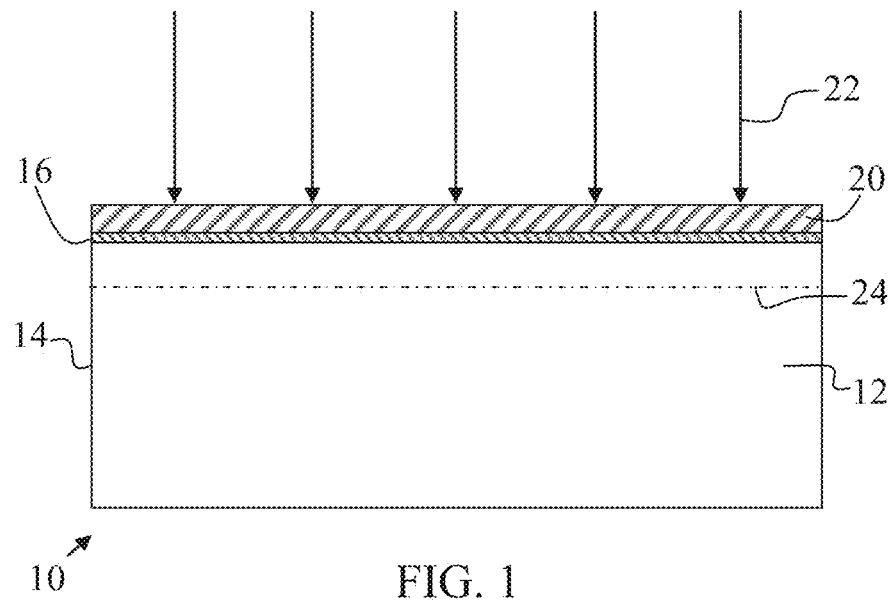
FIGS. 1-7 illustrate, in cross section, a portion of an integrated circuit and method steps for fabricating the integrated circuit in accordance with various embodiments herein.

The following detailed description is merely exemplary in nature and is not intended to limit the integrated circuits, the methods for fabricating integrated circuits, or the methods for fabricating memory cells as claimed herein. Furthermore, there is no intention to be bound by any expressed or implied theory presented in the preceding technical field, background or brief summary, or in the following detailed description.

In accordance with the various embodiments herein, integrated circuits, methods for fabricating integrated circuits, and methods for fabricating memory cells are provided. Generally, the following embodiments relate to the formation of split-gate flash memory cell. As described herein, the fabrication methods provide the exemplary split-gate flash memory cell with a dedicated select gate dielectric layer, i.e., a material layer that is not utilized in the logic areas of the integrated circuit. As a result, the memory cell fabrication process is not dependent on logic gate dielectric layer formation. Therefore, the same process module may be used for split-gate flash memory cell fabrication regardless of the logic area components.

Embodiments described herein deposit a tunnel dielectric layer to form the select gate dielectric. Such processing may provide for increased cell parameter uniformity due to better process control from the tunnel dielectric thickness. Also, in the described methods, the tunnel dielectric is not contacted by photoresist, providing for better material quality. Further, because the logic gate dielectric material need not be utilized in the memory cell, the logic gate dielectric material may be better designed for use in devices in the logic area.

FIGS. 1-7 illustrate sequentially a method for fabricating an integrated circuit having a memory cell in accordance with various embodiments herein. The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Turning now to FIG. 1, in an exemplary embodiment, the process of fabricating an integrated circuit 10 includes providing a semiconductor substrate 12. The semiconductor substrate 12 for example is a silicon material as typically used in the semiconductor industry, e.g., relatively pure silicon as well as silicon admixed with other elements such as germanium, carbon, and the like. Alternatively, the semiconductor material can be germanium, gallium arsenide, or the like. The semiconductor material may be provided as a bulk semiconductor substrate, or it could be provided on a silicon-on-insulator (SOI) substrate, which includes a support substrate, an insulator layer on the support substrate, and a layer of silicon material on the insulator layer. Further, the semiconductor substrate 12 may optionally include an epitaxial layer (epi layer). Also, the semiconductor substrate 12 may be doped as desired.

FIG. 1 illustrates a memory area 14 of the semiconductor substrate 12. In FIG. 1, a dielectric layer 16 is deposited over the semiconductor substrate 12 in the memory area 14. An exemplary dielectric layer is silicon dioxide ("oxide"). In an exemplary embodiment, the dielectric layer 16 is formed by thermal oxidation or another well known technique such as chemical vapor deposition (CVD). The exemplary dielectric layer is an oxide layer formed with a thickness of from about 70 to about 120 Å.

As shown, a gate conductor material 20 is deposited over the dielectric layer 16 in the memory area 14. The gate conductor material 20 will be later processed to form floating gates. The gate conductor material 20 may be polycrystalline silicon ("polysilicon"). In an exemplary embodiment, the gate conductor material 20 is deposited to a thickness of about 400 to about 800 Å. The deposition of the gate conductor material 20 may be performed by a well known process such as Low Pressure CVD (LPCVD). The gate conductor material 20 may be planarized, such as by a chemical mechanical planarization process. In FIG. 1, the logic device area (not shown) may be masked while an implantation process is performed to implant ions indicated by arrows 22 into the semiconductor substrate 12 to form a well implant 24 for the memory area 14.

Figure 2:
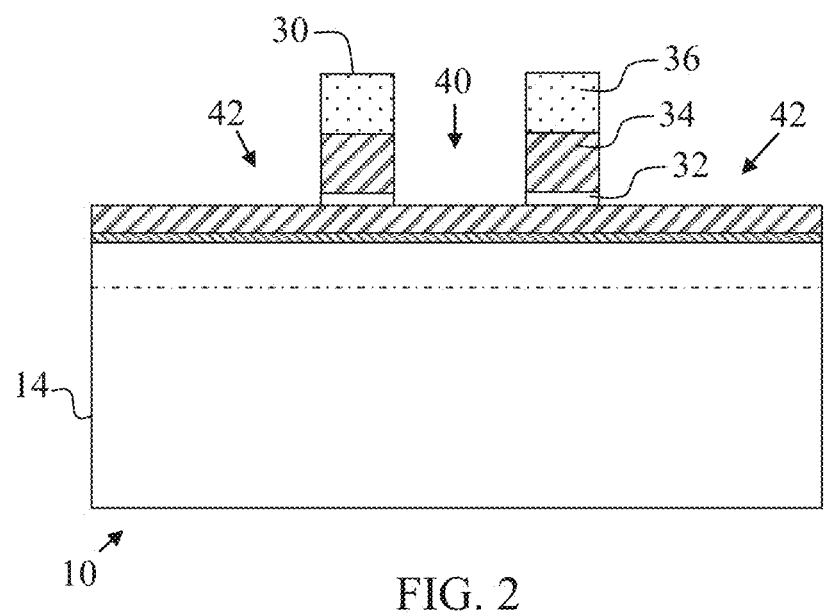

In FIG. 2, control gate stacks 30 are formed. Specifically, an insulating layer 32, a gate conductor material 34 and a cap material 36 are sequentially formed over the gate conductor material 20 and patterned. An exemplary insulating layer 32 is an inter-polysilicon dielectric ("IPD") layer. For example, the insulating layer 32 may be formed as a stack structure of an oxide layer, nitride layer, and oxide layer, i.e., an "ONO" stack. The insulating layer 32 may be formed by an appropriate oxidation or deposition process. The insulating layer 32 may have a thickness of about 100 to about 200 Å.

The gate conductor material 34 may be formed of polysilicon. The gate conductor material 34 may be deposited by a well known process such as LPCVD. An exemplary gate conductor material 34 has a thickness of about 400 to about 1000 Å.

The cap material 36 may be silicon nitride ("nitride") or another suitable hard mask material. For example, the cap material 36 may be a nitride layer, oxide layer, nitride layer stack, i.e., a "NON" stack. In an exemplary embodiment, the cap material 36 is deposited over the gate conductor material 34 by CVD processes. The cap material 36 may have a thickness of about 600 to about 2000 Å.

After a photoresist layer has been coated on the cap material 36, exposure and development are carried out on the photoresist layer to form a photoresist pattern (not shown in the drawing) defining a gate pattern area. The cap material 36, gate conductor material 34 and insulating layer 32 are etched using the photoresist pattern as an etch mask to form the two gate stacks 30. The photoresist pattern is then removed. The gate stacks 30 define an area 40 between the gate stacks 30 that will be used to form a source line and word line portion of the memory area 14. Area 40 may be referred to as source line area 40 for purposes of clarity. The gate stacks 30 further define areas 42 of the memory area 14 where select gates will be formed and may be referred to as select gate areas 42.

Figure 3:
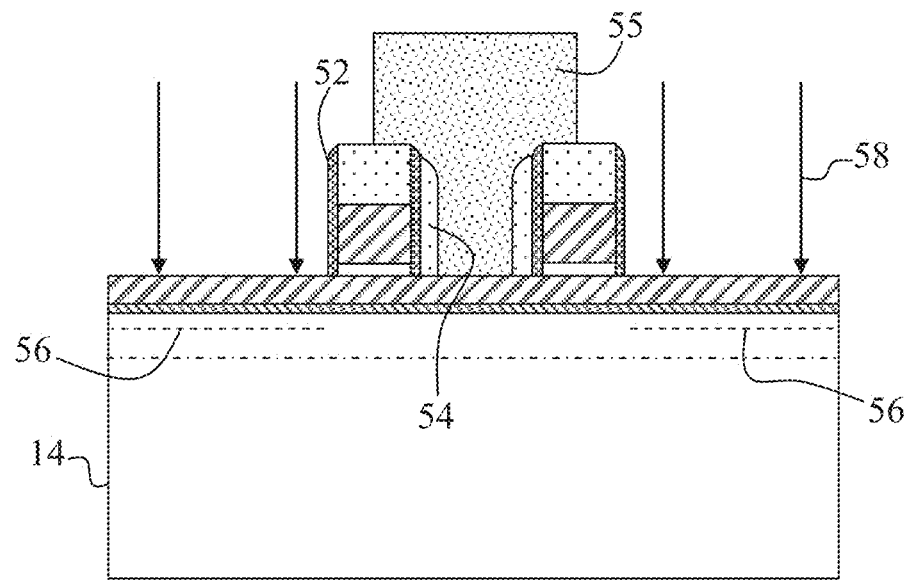

In FIG. 3, spacers 52 and 54 are formed around the gate stacks 30. In an exemplary embodiment, spacers 52 are oxide layers (or oxide and nitride) formed by deposition. After formation of spacers 52, spacers 54 may be formed over spacers 52 by deposition. Spacers 52 and 54 may be formed by LPCVD or plasma enhanced CVD (PECVD).

As shown, a mask 55 is formed and patterned to cover the source line area 40 in the memory area 14. Spacers 54 may be removed from the select gate areas 42. Then, a doping process may be performed to adjust the threshold voltage in the select gate areas 42. As a result, doped areas 56 are formed in the semiconductor substrate 12 in the select gate areas 42. In an exemplary embodiment, ions indicated by arrows 58 are implanted in the semiconductor substrate 12 to form the doped areas 56. Then the mask 55 is removed.

Figure 4:
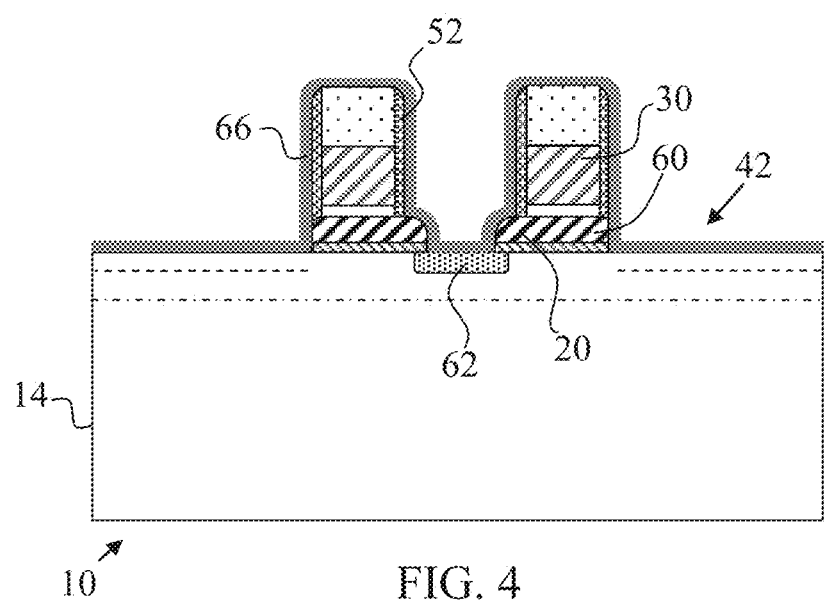

In FIG. 4, the gate conductor material 20 is etched using the spacers 52 and 54 as an etch mask. In an exemplary embodiment, the gate conductor material 20 is etched anisotropically by, for example, a reactive ion etch (RIE) process. As shown, the dielectric layer 16 is also etched anisotropically using the spacers 52 and 54 as a mask. As a result, floating gate structures 60 are formed under each control gate stack 30.

Then, a doping process is performed to form a source line junction or region 62 in the source line area 40. Typically, the select gate areas 42 are masked while the source line region 62 is doped. As shown, the mask and spacers 54 are then removed. A dielectric material 66 is formed over the gate stacks 30, the source line region 62, and the select gate areas 42. In an exemplary embodiment, the dielectric material 66 is a tunnel oxide. The tunnel dielectric 66 may be formed by LPCVD or PECVD. The tunnel dielectric 66 may be precisely formed such that it has a thickness that varies by no more than about 2 Å. An exemplary dielectric material 66 is formed with a thickness of about 70 to about 150 Å.

Figure 5:
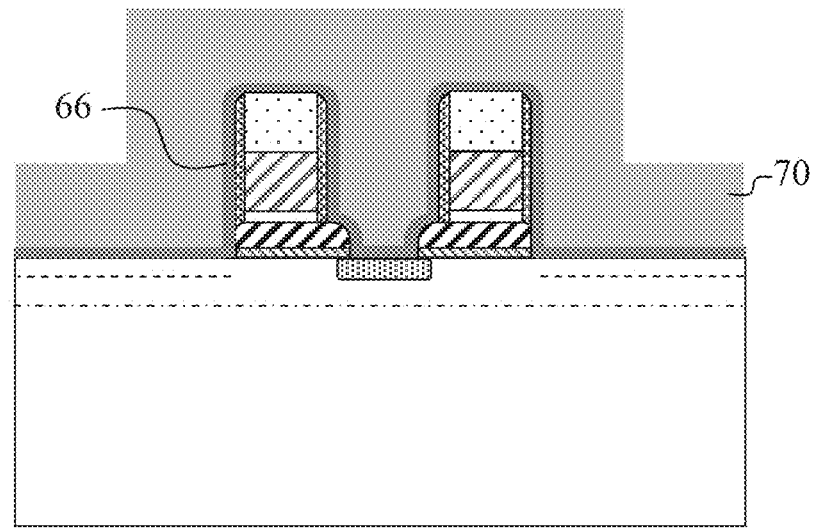

In FIG. 5, a conductive gate material 70 is conformally deposited over the gate stacks 30, the select gate areas 42 and the source line region 62. Conductive gate material 70 is a material that may be processed to form a word line and select gates. An exemplary conductive gate material 70 is polysilicon. In an exemplary embodiment, the conductive gate material 70 is deposited to a thickness of about 500 to about 1800 Å. The deposition of the gate conductor material 20 may be performed by a well known process such as Low Pressure CVD (LPCVD). Portions of the gate conductor material 20 may be planarized, such as by chemical-mechanical planarization, as shown in FIG. 5.

Figure 6:
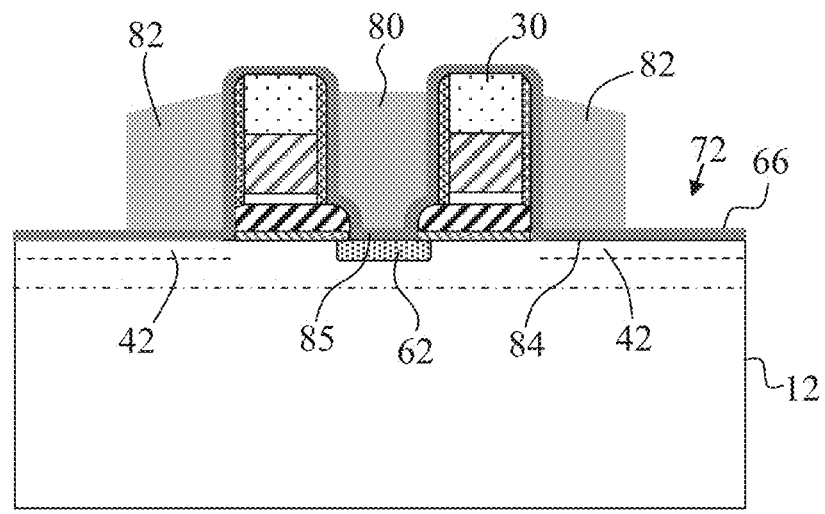

An etch may be performed as shown in FIG. 6 to remove the conductive gate material 70 from areas 72 adjacent select gate areas 42 and to reduce the height of the conductive gate material 70 to expose the gate stacks 30. As a result, a word line 80 is formed over the source line region 62 between the stacks 30 and select gates 82 are formed over the select gate areas 42 of the semiconductor substrate 12. The portions of the tunnel dielectric 66 positioned under the select gates 82 form select gate dielectric layers 84 and the portion of the tunnel dielectric 66 positioned under the word line 80 forms a word line dielectric layer 85.

Figure 7:
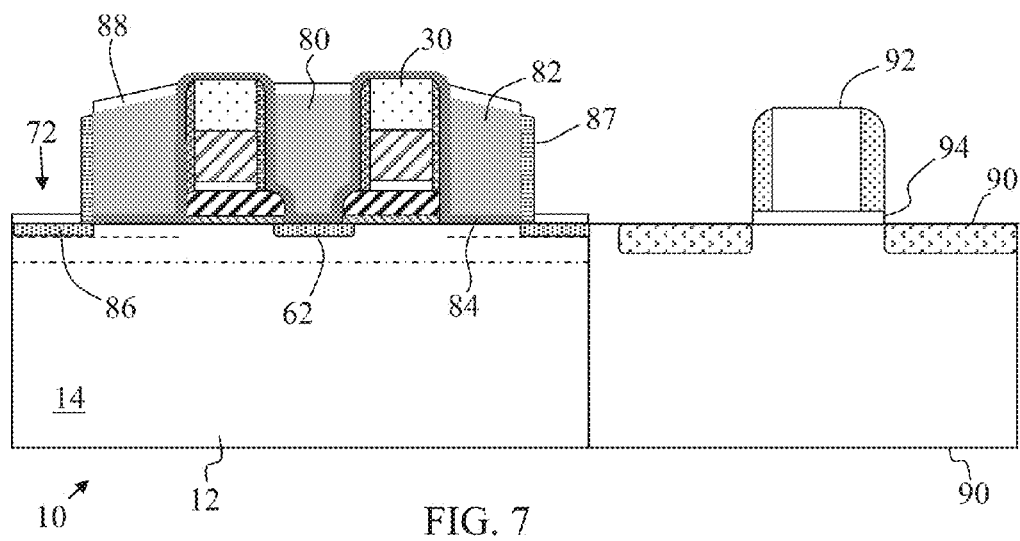

In FIG. 7, the tunnel dielectric 66 may be removed from the areas 72 adjacent the select gates 82. Further, doping processes may be performed to form doped regions 86 in the areas 72 adjacent the select gates 82. Spacers 87 may be formed and used during implantation processes for forming the doped regions 86. As shown, contacts 88 may be formed over doped regions 86, select gates 82, and word line 80. Typically, an interlayer dielectric (not shown) is deposited over the memory area 14 and processing may continue with the formation of electrical connections.

FIG. 7 illustrates the memory area 14 and a logic area 90 formed on the integrated circuit 10. While shown in an adjacent position, the memory area 14 and logic area 90 may be located apart from one another on the semiconductor substrate 12. As shown, the logic area 90 includes a gate structure 92 overlying a gate dielectric 94 and source/drain regions 96. Such features may be formed according to known conventional steps. Further, the features may be formed for a high voltage device region, an input/output device region, and/or a core device region in logic area 90.

During processing of the memory area 14 to form the stacks 30, floating gate structures 60, source line region 62, word line 80, and select gates 82, the logic area 90 may be selectively masked. Likewise, during formation of the gate structure 92, gate dielectric 94, source/drain regions 96 and other features formed in the logic area 90, the memory area 14 may be selectively masked. For example, the memory area 14 is masked while a material for forming the gate dielectric 94 is formed over the logic area 90. Likewise, the memory area 14 may be masked while layers are deposited and etched to form the gate structure 92. As noted above, the gate dielectric 94 and the select gate dielectric 84 are not formed from a same layer. Rather, the select gate dielectric 84 is formed independent of processing in the logic area 90 such as by formation of a tunnel layer in the memory area 14. In an exemplary embodiment, the tunnel dielectric 66 is deposited over the memory area 14 and the logic area 90. The memory area 14 may then be masked while the tunnel dielectric 66 is removed from the logic area 90. Then, the gate dielectric 94 may be formed over the logic area 90.

In summary, a fabrication process is implemented to form an integrated circuit with improved nonvolatile memory devices. Select gate dielectric layers are formed with processing performed only in the memory area and independent of logic area processing. Exemplary select gate dielectric layers are formed as tunnel oxide with precise thicknesses. The methods provided herein result in nonvolatile memory devices having improved performance.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating a memory cell, the method comprising:
   depositing a first tunnel dielectric layer over a semiconductor substrate;
   depositing a floating gate material over the first tunnel dielectric layer;
   forming two control gate stacks over the floating gate material, wherein a source line area is defined between the two control gate stacks, and wherein select gate areas are defined adjacent the two control gate stacks;
   doping the select gate areas before depositing a second tunnel dielectric layer over the select gate areas of the semiconductor substrate; and
   forming select gates over the second tunnel dielectric layer over the select gate areas of the semiconductor substrate, wherein the second tunnel dielectric layer forms a gate dielectric layer for each select gate.

2. The method of claim 1 wherein depositing the second tunnel dielectric layer over the select gate areas of the semiconductor substrate comprises depositing the second tunnel dielectric layer over the control gate stacks and over the source line area.

3. The method of claim 1 wherein forming two control gate stacks over the floating gate material comprises depositing a control gate material over the floating gate material and etching the control gate material to form the control gate stacks over the floating gate material; and wherein the method further comprises:
  forming spacers adjacent the control gate stacks; and
  etching the floating gate material while using the spacers as a mask to form a floating gate under each control gate stack before depositing the second tunnel dielectric layer over the select gate areas of the semiconductor substrate.

4. The method of claim 3 further comprising doping the source line area while using the spacers as a mask to form a source line between the floating gates.

5. The method of claim 1 wherein forming two control gate stacks over the floating gate material comprises depositing a control gate material over the floating gate material and etching the control gate material to form the control gate stacks over the floating gate material; and wherein the method further comprises:
  forming first spacers adjacent the control gate stacks;
  forming second spacers adjacent the first spacers;
  etching the floating gate material while using the first spacers and second spacers as a mask to form a floating gate under each control gate stack; and
  doping the source line area while using the first spacers and second spacers as an implantation mask.

6. The method of claim 1 wherein forming select gates over the second tunnel dielectric layer over the select gate areas of the semiconductor substrate comprises:
  depositing a gate material over the semiconductor substrate and control gate stacks; and
  etching the gate material from the semiconductor substrate adjacent the select gate areas, wherein forming select gates over the second tunnel dielectric layer of the select gate areas over the semiconductor substrate comprises forming a word line over the source line area.

7. The method of claim 1 wherein forming select gates over the second tunnel dielectric layer over the select gate areas of the semiconductor substrate comprises forming a word line over the source line area.

8. The method of claim 1 wherein each gate stack has an inward side and an outward side and wherein the
  method further comprises:
  forming first spacers adjacent the control gate stacks;
  forming second spacers adjacent the first spacers;
  masking the second spacers and first spacers adjacent the inward sides of the control gate stacks with a mask; and
  removing the second spacers adjacent the outward sides of the control gate stacks, wherein doping the select gate areas comprises doping the select gate areas while using the mask and the first spacers adjacent the outward sides of the control gate stacks.

9. The method of claim 8 wherein the method further comprises:
  etching the floating gate material while using the first spacers and second spacers as a mask to form a floating gate under each control gate stack; and
  doping the source line area while using the first spacers and second spacers adjacent the inward sides of the control gate stacks as an implantation mask.

10. The method of claim 9 wherein the method further comprises removing the second spacers adjacent the inward sides of the control gate stacks and revealing an upper surface of each floating gate, wherein depositing the second tunnel dielectric layer comprises forming the second tunnel dielectric layer on the upper surface of each floating gate.

11. The method of claim 1 wherein depositing the second tunnel dielectric layer over the select gate areas of the semiconductor substrate comprises forming the second tunnel dielectric layer with a thickness of from 70 to 150 Å.

12. A method for fabricating an integrated circuit, the method comprising:
  providing a semiconductor substrate having a logic area and a memory area;
  depositing a floating gate material over the memory area;
  forming two control gate stacks over the floating gate material in the memory area;
  depositing a tunnel dielectric layer over the two control gate stacks and the memory area;
  forming select gates over the tunnel dielectric layer in the memory area;
  forming a gate dielectric layer over the logic area; and
  forming logic gates over the gate dielectric layer in the logic area.

13. The method of claim 12 wherein depositing the tunnel dielectric layer over the two control gate stacks and the memory area comprises depositing the tunnel dielectric layer over the memory area and over the logic area.

14. The method of claim 12 wherein forming two control gate stacks over the floating gate material in the memory area comprises defining a source line area between the two control gate stacks, and wherein forming select gates over the tunnel dielectric layer in the memory area comprises forming a word line over the source line area.

15. The method of claim 12 wherein the logic area includes a high voltage device region, an input/output device region, and a core device region, and wherein forming a gate dielectric layer over the logic area comprises forming a high voltage device gate dielectric over the high voltage device region, forming an input/output device gate dielectric over the input/output device region, and forming a core device gate dielectric over the core device region.

16. The method of claim 12 wherein depositing the tunnel dielectric layer over the two control gate stacks and the memory area comprises forming silicon oxide over the two control gate stacks and the memory area by a CVD process.

17. The method of claim 12 wherein depositing the tunnel dielectric layer over the two control gate stacks and the memory area comprises forming silicon oxide with a thickness of from 70 to 150 Å over the two control gate stacks and the memory area.

18. An integrated circuit comprising:
  a semiconductor substrate including a memory area;
  a first tunnel dielectric layer overlying the semiconductor substrate in the memory area;
  a floating gate material overlying the first tunnel dielectric layer;
  two control gate stacks overlying the floating gate material, wherein a source line area is defined between the two control gate stacks and select gate areas are defined adjacent the two control gate stacks;
  a second tunnel dielectric layer overlying the select gate areas of the semiconductor substrate;
  a word line over the source line area; and
  select gates overlying the second tunnel dielectric layer over the select gate areas of the semiconductor substrate, wherein the second tunnel dielectric layer forms a select gate dielectric layer for each select gate.

19. The integrated circuit of claim 18 wherein the second tunnel dielectric layer lies over the two control gate stacks.

20. The integrated circuit of claim 18 wherein the word line lies over the second tunnel dielectric layer.

* * * * *